United States Patent [19]
Kim

[11] Patent Number: 5,726,585
[45] Date of Patent: Mar. 10, 1998

[54] SWITCHING CIRCUIT FOR USE IN A SEMICONDUCTOR MEMORY DEVICE

[75] Inventor: Kwang-Il Kim, Kyungki-do, Rep. of Korea

[73] Assignee: Samsung Electronics Co., Ltd., Suwon, Rep. of Korea

[21] Appl. No.: 651,801

[22] Filed: May 24, 1996

[30] Foreign Application Priority Data

May 25, 1995 [KR] Rep. of Korea ............... 13264/1995

[51] Int. Cl.⁶ .................................................. H03K 19/177
[52] U.S. Cl. .................................... 376/38; 326/47; 327/525
[58] Field of Search ........................... 327/34, 77, 176, 327/525; 326/10, 37, 38, 47, 62

[56] References Cited

U.S. PATENT DOCUMENTS

| | | |
|---|---|---|
| 4,689,494 | 8/1987 | Chen et al. ............... 326/38 X |
| 4,761,570 | 8/1988 | Williams .................. 326/38 X |
| 5,051,615 | 9/1991 | Rosenthal ................ 327/77 X |
| 5,200,652 | 4/1993 | Lee ........................ 326/10 X |
| 5,387,823 | 2/1995 | Ashizawa ................ 327/525 X |
| 5,428,311 | 6/1995 | McClure ................. 327/525 X |

*Primary Examiner*—David R. Hudspeth
*Attorney, Agent, or Firm*—Cushman Darby & Cushman IP Group of Pillsbury Madison & Sutro LLP

[57] ABSTRACT

A switching circuit has first type and second type fuse circuits which respectively receive a plurality of input signals, the first type fuse circuit having a switching characteristic opposite to that of the second type fuse circuit. An input stage is commonly connected to the outputs of the first type and second type fuse circuits. The fuse circuits propagate the input signals according to a cut state of fuses therein, such that a signal path of the switching circuit is optimally adjusted through the fuse circuits by a simple fuse cutting operation.

19 Claims, 4 Drawing Sheets

SWITCHING CIRCUIT FOR USE IN A SEMICONDUCTOR MEMORY DEVICE

BACKGROUND OF THE INVENTION

1. Field of the Invention

The present invention relates to switching circuits for use in semiconductor memory devices, and more particularly, to a switching circuit in which a switching delay path can be easily optimized by a fuse cutting operation. The present application is based on Korean Patent Application Ser. No. 13264/1995, which is incorporated herein by reference for all purposes.

2. Description of the Related Art

FIGS. 1 and 2 are circuit diagrams showing conventional switching circuits used in semiconductor memory devices. The switching circuit shown in FIG. 1 includes a NAND gate 16 which receives an input signal A at one input terminal and receives the input signal A at the other input terminal through a plurality of inverters 10, 11, 12, 13, 14, 15, 17 and 18 connected to switch terminals 100, 102, 104, 106 and 108.

In the switching circuit shown in FIG. 2, a NAND gate 20 receives input signals A and B and the output terminal thereof is connected to the input terminal of an inverter 23. A NOR gate 21 receives input signals C and D and the output terminal thereof is connected to the input terminal of the inverter 23 through a switch terminal 24, and an inverter 22 receives an input signal E and the output terminal thereof is connected to the input terminal of the inverter 23 through a switch terminal 25.

To optimize a time delay, an inverter delay chain or circuit path is formed by selectively connecting the switch terminals (or metal option) in the conventional circuits shown in FIGS. 1 and 2. However, one problem with this technique is that a process of cutting off the unused switch terminals by using an ion beam (e.g., a Focused Ion Beam) is required. This in turn requires an additional masking step.

SUMMARY OF THE INVENTION

It is therefore an object of the present invention to provide a switching circuit of a semiconductor memory device in which a delay path is capable of optimization without requiring an ion beam cutting process or an additional masking step.

It is another object of the present invention to provide a switching circuit in which a delay path is capable of being isolated or changed only by a fuse cutting operation when the semiconductor memory device is in a wafer state.

To achieve the above objects, the switching circuit of the present invention has first type and second type fuse circuits which respectively receive a plurality of input signals, the first type fuse circuit having a switching characteristic opposite to that of the second type fuse circuit. An input stage is commonly connected to the outputs of the first type and second type fuse circuits. The fuse circuits propagate the input signals according to a cut state of fuses therein, such that a signal path of the switching circuit is optimally adjusted through the fuse circuits by a simple fuse cutting operation.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

Preferred embodiments of the present invention will now be discussed in detail with reference to the accompanying drawings.

Figure 1:
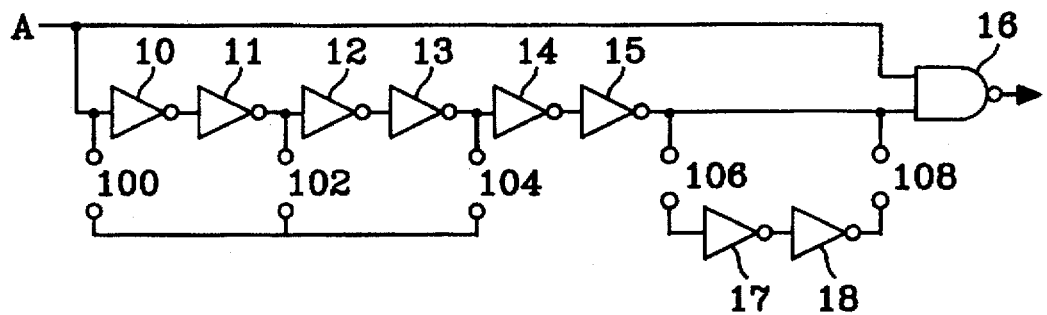
FIGS. 1 and 2 are circuit diagrams showing conventional switching circuits for use in semiconductor memory devices.
Figure 2:
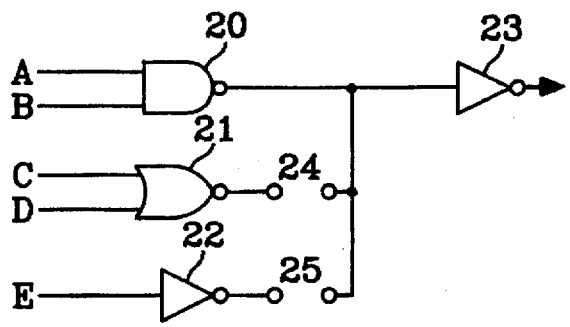
Figure 3:
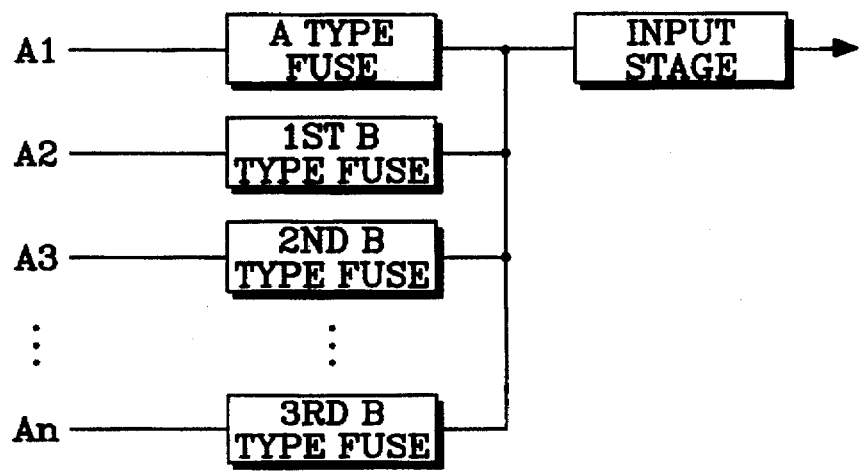
FIG. 3 is a circuit diagram of a switching circuit for a semiconductor memory device according to a preferred embodiment of the present invention.

A switching circuit for a semiconductor memory device according to a first preferred embodiment of the present invention is shown in FIG. 3. As shown in FIG. 3, the switching circuit has an A type fuse circuit 31 which receives an input signal A1, a first B type fuse circuit 33 which receives an input signal A2, a second B type fuse circuit 35 which receives an input signal A3, a third B type fuse circuit 37 which receives an input signal An and an input stage 39 commonly connected to the outputs of the A type fuse circuit and first, second and third B type fuse circuits. The A type fuse circuit is turned on before a fuse therein is cut off and is turned off after the fuse is cut off, whereas the B type fuse circuit is turned off before a fuse therein is cut off and is turned on after the fuse is cut off.

When a specific path is selected by a fuse cutting operation, the outputs of the fuse circuits associated with unselected paths can be stabilized. The A type fuse circuit which is turned on before the fuse therein is cut off is connected to only one of the input signals, and the B type fuse circuits which have a switching characteristic opposite to that of the A type fuse circuit are connected to the remaining input signals. Since the A type and B type fuse circuits are commonly connected to the input stage of the switching circuit, if there is more than one A type fuse circuit in the switching circuit, this may cause a short circuit.

In order to change the path of the switching circuit comprised of the A type and B type fuse circuits, first the fuse within the A type fuse circuit is cut off and then the fuse within one of the B type fuse circuits which is associated with the path to be changed is cut off. Hence, before the fuse within the A type fuse circuit is cut off, the path is formed through the A type fuse circuit; whereas after the fuse within the A type fuse circuit is cut off and the fuse within one B type fuse circuit is cut off, the path is formed only through the B type fuse circuit, the fuse of which has been cut off.

Therefore, only one path can be formed both before and after the fuse cutting. With the output through this one path, the outputs of the fuse circuits associated with the unselected paths are not in floating states but in stable states.

Figure 4:
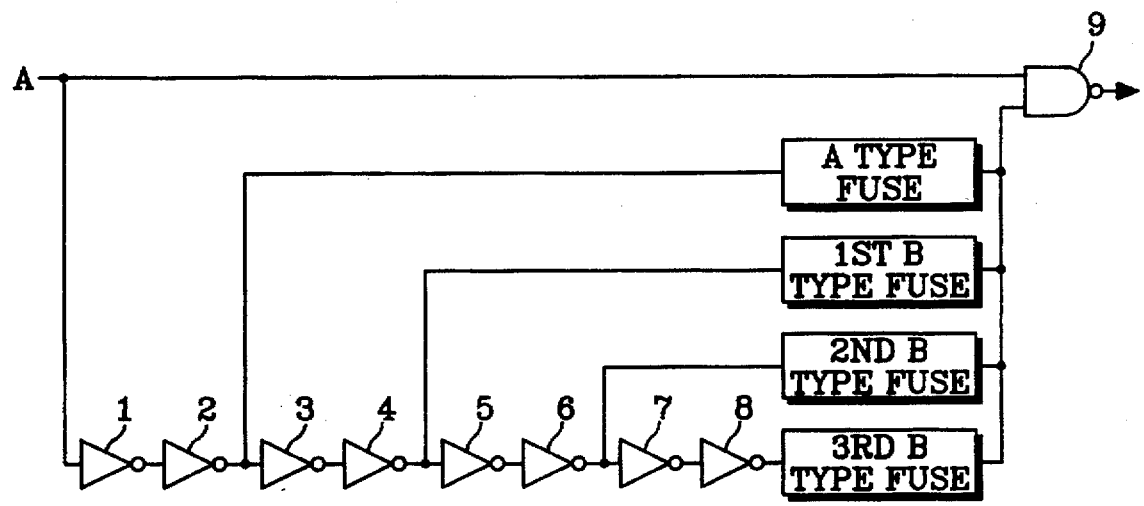
FIG. 4 is a circuit diagram of a switching circuit for a semiconductor memory device according to another preferred embodiment of the present invention.

FIG. 4 shows a switching circuit for a semiconductor memory device according to another preferred embodiment of the present invention wherein fuse circuits are respectively connected to a plurality of delay circuits. As shown in FIG. 4, an A type fuse circuit 401 receives an input signal through first and second inverters 41 and 42, a first B type fuse circuit 403 receives the input signal through first, second, third and fourth inverters 41, 42, 43 and 44. A second B type fuse circuit 405 receives the input signal through first, second, third, fourth, fifth and sixth inverters 41, 42, 43, 44, 45 and 46, and a third B type fuse 407 circuit receives the input signal through first, second, third, fourth, fifth, sixth, seventh and eighth inverters 41, 42, 43, 44, 45, 46, 47 and 48. A NAND gate 49 receives the input signal at one input terminal and commonly receives the outputs of the A type fuse circuit and first, second and third B type fuse circuits at the other input terminal. With this configuration, the switching circuit of FIG. 4 can be adjusted for optimal time delay simply by a fuse cutting operation.

Figure 5:
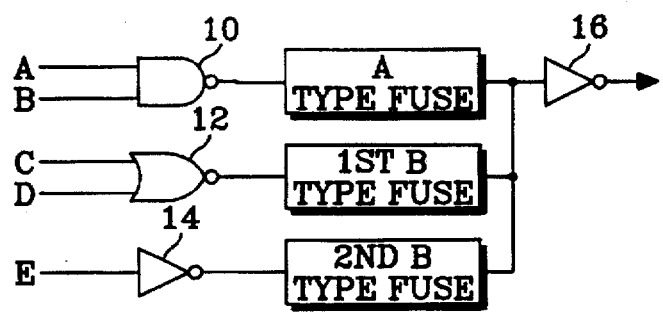
FIG. 5 is a circuit diagram of a switching circuit for a semiconductor memory device according to a third preferred embodiment of the present invention.

FIG. 5 shows a switching circuit for a semiconductor memory device according to a third preferred embodiment of the present invention wherein fuse circuits are respectively connected to a plurality of logic circuits. As shown in FIG. 5, an A type fuse circuit 51 is connected to the output terminal of NAND gate 50 which receives input signals A and B, a first B type fuse circuit 53 is connected to the output terminal of a NOR gate 52 which receives input signals C and D and a second B type fuse circuit 55 is connected to the output terminal of an inverter 54 which receives an input signal E. The outputs of the A type fuse circuit and first and second B type fuse circuits are commonly connected to an inverter 56. With this configuration, it is possible to change the delay path for optimal time delay simply by a fuse cutting operation.

Figure 6A:
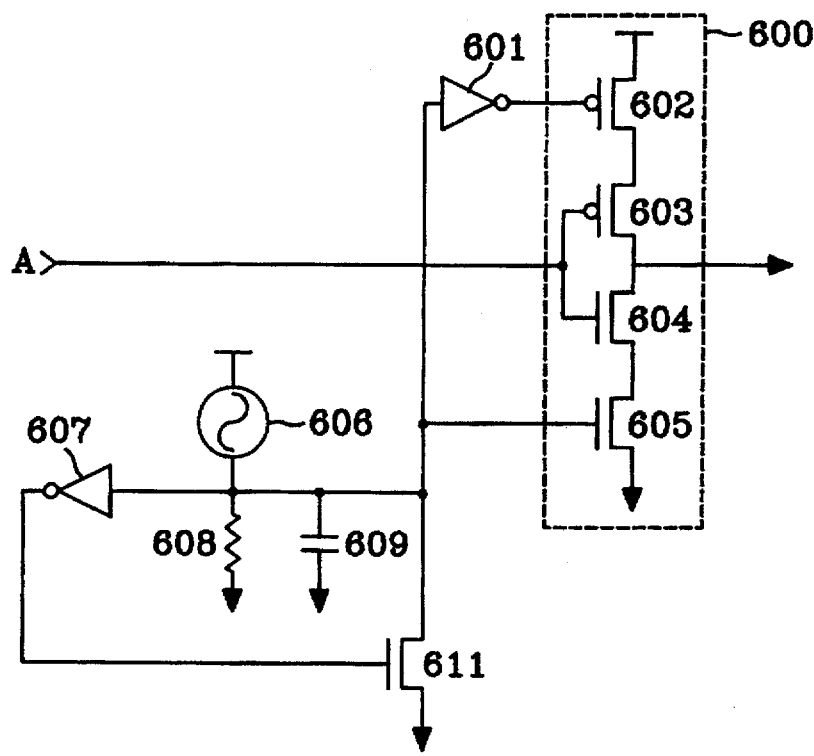
FIGS. 6A and 6B are diagrams showing examples of an A type fuse circuit.
Figure 6B:
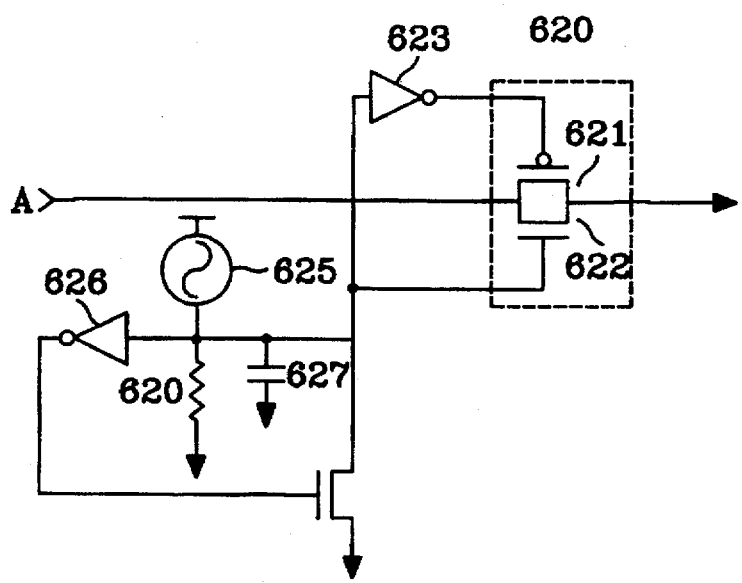
Figure 7A:
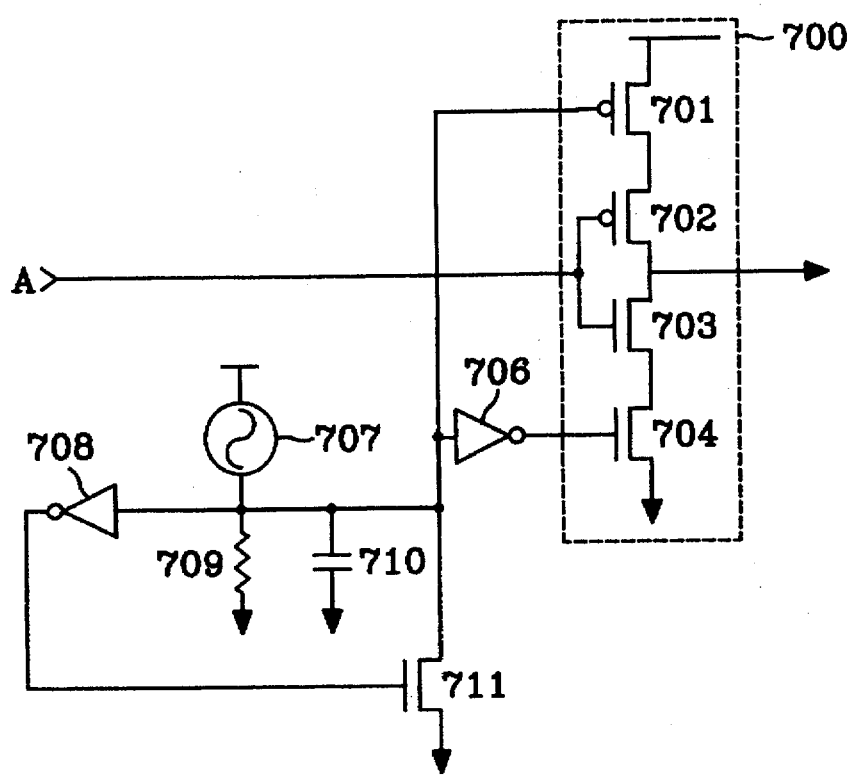
FIGS. 7A and 7B are diagrams showing examples of a B type fuse circuit.
Figure 7B:
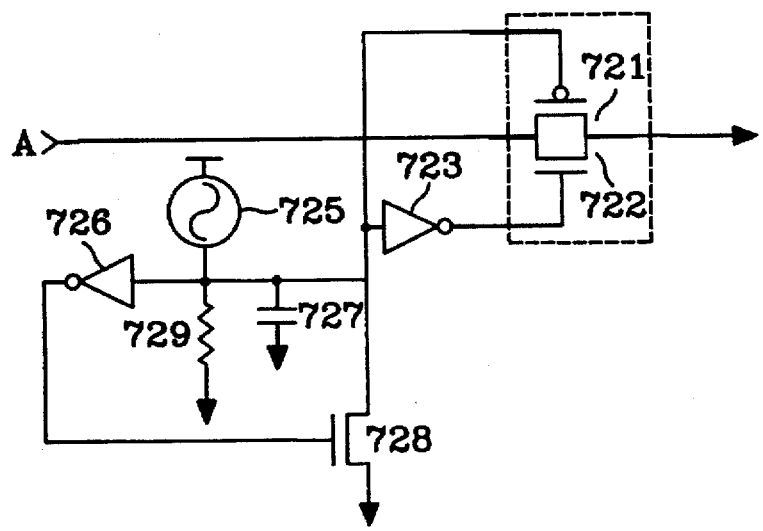

FIGS. 6A and 6B show examples of the A type fuse circuit and FIGS. 7A and 7B show examples of the B type fuse circuit. The configurations of these fuse circuits are straightforward and will not be discussed in detail. As can be clearly seen from FIGS. 6A and 6B, the A type fuse circuits propagate the input signal A therethrough when the fuses 606 and 625 are not cut. Likewise, as seen from FIGS. 7A and 7B, the B type fuse circuits propagate the input signal A therethrough only if the fuses 707 and 725 have been cut.

Although there have been illustrated and described what are considered to be preferred embodiments of the present invention, it will be understood by those skilled in the art that various changes and modifications may be made thereto without departing from the scope of the present invention. Therefore, it is intended that the present invention not be limited to the particular embodiments disclosed as the best mode contemplated for carrying out the present invention, but that the present invention includes all embodiments falling within the spirit and scope of the appended claims.

What is claimed is:

1. A switching circuit of a semiconductor memory device comprising:

a plurality of first type and second type fuse circuits which respectively receive a plurality of input signals, said first type fuse circuit having a switching characteristic opposite to that of said second type fuse circuit; and an input stage commonly connected to the outputs of said first type and second type fuse circuits, certain of said input signals being propagated through respective ones of said fuse circuits to said input stage according to a cut state of fuses within all of said fuse circuits.

2. The switching circuit according to claim 1, wherein said switching characteristic of said first type fuse circuit is that a signal path therethrough is turned on before said fuse therein is cut and is turned off after said fuse is cut.

3. The switching circuit according to claim 2, wherein said switching characteristic of said second type fuse circuit is that a signal path therethrough is turned off before said fuse therein is cut and is turned on after said fuse is cut.

4. The switching circuit according to claim 1, wherein said plurality of first type and second type fuse circuits includes only one first type fuse circuit.

5. A switching circuit of a semiconductor memory device comprising:

a plurality of first type and second type fuse circuits respectively connected to a plurality of delay circuits, said first type fuse circuit having a switching characteristic opposite to that of said second type fuse circuit; and an input stage commonly connected to the outputs of said first type and second type fuse circuits, an input signal being propagated to said input stage through certain of said delay circuits and respective ones of said fuse circuits according to a cut state of fuses within all of said fuse circuits.

6. The switching circuit according to claim 5, wherein said plurality of first type and second type fuse circuits includes only one first type fuse circuit.

7. The switching circuit according to claim 5, wherein said switching characteristic of said first type fuse circuit is that a signal path therethrough is turned on before said fuse therein is cut and is turned off after said fuse is cut.

8. The switching circuit according to claim 7, wherein said switching characteristic of said second type fuse circuit is that a signal path therethrough is turned off before said fuse therein is cut and is turned on after said fuse is cut.

9. The switching circuit according to claim 5, wherein said plurality of first and second type fuse circuits comprises:

a first type fuse circuit which receives said input signal through a first one of said delay circuits;

a first second type fuse circuit which receives said input signal through a second one of said delay circuits;

a second second type fuse circuit which receives said input signal through a third one of said delay circuits; and a third second type fuse circuit which receives said input signal through a fourth one of said delay circuits, and wherein said input stage includes a logic circuit which receives said input signal at one input terminal and commonly receives the outputs of said first and second type fuse circuits at the other input terminal.

10. The switching circuit according to claim 9, wherein said switching characteristic of said first type fuse circuit is that a signal path therethrough is turned on before said fuse therein is cut and is turned off after said fuse is cut.

11. The switching circuit according to claim 10, wherein said switching characteristic of said second type fuse circuit is that a signal path therethrough is turned off before said fuse therein is cut and is turned on after said fuse is cut.

12. A switching circuit of a semiconductor memory device comprising:

a plurality of first type and second type fuse circuits respectively connected to a plurality of logic circuits, said first type fuse circuit having a switching characteristic opposite to that of said second type fuse circuit; and an input stage commonly connected to the outputs of said first type and second type fuse circuits, certain outputs of said logic circuits being propagated to said input stage through respective ones of said fuse circuits according to a cut state of fuses within all of said fuse circuits.

13. The switching circuit according to claim 12, wherein said plurality of first type and second type fuse circuits includes only one first type fuse circuit.

14. The switching circuit according to claim 12, wherein said switching characteristic of said first type fuse circuit is that a signal path therethrough is turned on before said fuse therein is cut and is turned off after said fuse is cut.

15. The switching circuit according to claim 14, wherein said switching characteristic of said second type fuse circuit is that a signal path therethrough is turned off before said fuse therein is cut and is turned on after said fuse is cut.

16. The switching circuit according to claim 12, wherein said switching circuit comprises:

a first type fuse circuit connected to an output terminal of a first one of said logic circuits, said first one of said logic circuits comprising a NAND gate which receives first and second input signals;

a first second type fuse circuit connected to an output terminal of a second one of said logic circuits, said second one of said logic circuits comprising a NOR gate which receives third and fourth input signals;

a second second type fuse circuit connected to an output terminal of a third one of said logic circuits, said third one of said logic circuits comprising an inverter which receives a fifth input signal, and wherein said input stage comprises an inverter commonly connected to the outputs of said first and second type fuse circuits.

17. The switching circuit according to claim 16, wherein said first one of said logic circuits comprising a NAND gate which receives first and second input signals; and wherein said second one of said logic circuits comprising a NOR gate which receives third and fourth input signals; and wherein said third one of said logic circuits comprising an inverter which receives a fifth input signal.

18. The switching circuit according to claim 16, wherein said switching characteristic of said first type fuse circuit is that a signal path therethrough is turned on before said fuse therein is cut and is turned off after said fuse is cut.

19. The switching circuit according to claim 18, wherein said switching characteristic of said second type fuse circuit is that a signal path therethrough is turned off before said fuse therein is cut and is turned on after said fuse is cut.

\* \* \* \* \*